(12) United States Patent
Lee et al.

(10) Patent No.: US 6,569,778 B2
(45) Date of Patent: May 27, 2003

(54) METHOD FOR FORMING FINE PATTERN IN SEMICONDUCTOR DEVICE

(75) Inventors: Sung-Kwon Lee, Kyoungki-do (KR); Chang-Youn Hwang, Kyoungki-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/166,133

(22) Filed: Jun. 10, 2002

(65) Prior Publication Data

US 2003/0003714 A1 Jan. 2, 2003

(30) Foreign Application Priority Data

Jun. 28, 2001 (KR) .......................................... 2001-37491
Dec. 14, 2001 (KR) .......................................... 2001-79234

(51) Int. Cl.[7] ....................... H01L 21/461; H01L 21/302
(52) U.S. Cl. ....................... 438/734; 438/738; 438/637; 430/5; 430/270.1
(58) Field of Search ................................ 438/734, 735, 438/737, 738, 778, 780, 781, 736, 950, 952; 430/5, 270.1, 320, 325, 311

(56) References Cited

U.S. PATENT DOCUMENTS

| | | | |
|---|---|---|---|
| 6,316,349 B1 | * | 11/2001 | Kim et al. .................. 438/637 |
| 6,436,841 B1 | * | 8/2002 | Tsai et al. .................. 438/738 |
| 2002/0142610 A1 | * | 10/2002 | Chien et al. ................ 438/710 |

* cited by examiner

Primary Examiner—Wael Fahmy
Assistant Examiner—Aneta Cieslewicz
(74) Attorney, Agent, or Firm—Marshall, Gerstein & Borun

(57) ABSTRACT

A fine pattern forming method of a semiconductor device sequentially deposits an etch-target layer to be formed as the fine pattern, an anti-reflective layer and a photoresist film on a prepared semiconductor substrate and forms a photoresist pattern by performing photolithography for the photoresist film with an ArF exposure source. Then, two etching processes are performed to form the fine pattern. In one etching process, there are etched the anti-reflective layer and a portion of a non-pattern area of the etch-target layer at a first substrate temperature with fluorine-based gas and argon gas by using the photoresist pattern as an etching mask. In the other etching process, there is etched a remaining portion of the non-pattern area of the etch-target layer at a second substrate temperature higher than the first substrate temperature with fluorine-based gas and argon gas.

19 Claims, 4 Drawing Sheets

METHOD FOR FORMING FINE PATTERN IN SEMICONDUCTOR DEVICE

FIELD OF THE INVENTION

The present invention relates to a semiconductor device fabricating method; and, more particularly, to a method for forming a fine pattern in a semiconductor device through the use of an ArF exposure source.

DESCRIPTION OF RELATED ART

In recent times, a photolithography process has been widely used as a technology for forming a fine pattern required for achieving high-integration semiconductor devices. Therefore, it is very important for the high-integration of the semiconductor devices to improve the resolution of the photolithography.

In general, the photolithography process is performed through two processes, i.e., a process of forming a photoresist pattern and a process of etching a non-pattern area of an etch-target layer by using the photoresist pattern as a mask to thereby obtain a desired pattern, e.g., a contact hole, a bit line, etc. Herein, the photoresist pattern is made by coating a photoresist film on the etch-target layer, exposing the coated photoresist film by using a prepared exposure mask and developing an exposed or unexposed portion of the coated photoresist film by using a chemical solution.

Meanwhile, a critical dimension (CD) of the desired pattern formable through the photolithography process is determined by a wavelength of a light source used in the above exposure process because the CD of the desired pattern is decided depending on a width of the photoresist pattern formable by the above exposure process.

After mass production of semiconductor products including dynamic random access memories (DRAMs) started, the photolithography has made rapid progress. The integration of the DRAM has increased about 4 times every 3 years and the integration speed of other memory devices is about 2 or 3 years later than that of the DRAM. As a result, a product design has developed from 0.8 $\mu$m of 4M bit DRAM to 0.13 $\mu$m of 4G bit DRAM. Now, non-optical photolithography is emerging.

The resolution of the optical photolithography is inversely proportional to a wavelength of an exposure source. Therefore, an early stepper adopting an exposure scheme of "step and repetition" used a light source providing a wavelength of 436 nm (g-line) and a wavelength of 365 nm (i-line) and, now, it is using a scanner type exposure equipment or a stepper utilizing deep ultra-violet (DUV) having a 248 nm wavelength (KrF excimer laser).

In the optical photolithography, there have been many developments in materials such as chemically amplified resist (CAR), in a processing aspect, such as tri-layer resist (TLR), bi-layer resist (BLR), top surface imaging (TSI), anti-reflective coating (ARC), etc., and in a mask aspect, such as a phase shift mask (PSM), optical proximity correction (OPC), etc. as well as in the exposure equipment itself, such as a lens having a numeral aperture higher than 0.6 nm and hardware.

The 248 nm DUV photolithography was usually utilized in forming products having a design rule of 0.18 $\mu$m since it had many defects such as a time-delay effect, material dependency and so on. Therefore, in order to fabricate products having a design rule lower than 0.15 $\mu$m, there needed new DUV photolithography employing a wavelength of 193 nm (ArF excimer laser). However, since it was impossible for this DUV photolithography to form a pattern lower than 0.1 $\mu$m although various technologies are employed to enhance the resolution, photolithography using a new light source has developed.

As a result, there have been introduced exposure equipments using an electronic beam and an X-ray as the light source. In addition, an extreme ultraviolet technology using a weak X-ray as the light source is developing.

The early exposure equipment employed an exposing scheme where a mask was located on an upper portion of a substrate to be close to the substrate and its focus was adjusted with operator's eyes. Then, as this technology was developing, the resolution was enhanced by reducing a gap between the mask and the substrate and the exposure was achieved through soft contact or hard contact (lower than 10 $\mu$m) according to the gap size.

Recently, as there have developed an exposure equipment using KrF laser having a wavelength of 248 nm as the light source, photoresist materials and other incidental technologies, it becomes possible to form a pattern having a design rule lower than 0.15 $\mu$m.

Now, there is developing a technology capable of forming a fine pattern ranging from 0.11 $\mu$m to 0.07 $\mu$m by using an exposure equipment employing ArF laser having a wavelength of 193 nm. The DUV photolithography has high resolution and good DOF (depth of focus) property compared to the i-line, whereas it is not easy to control its manufacturing process. This process control problem is resulted from an optical cause due to a short wavelength and a chemical cause induced by using chemically amplified photoresist. As the wavelength is shorter, a CD tilting phenomenon due to a static wave effect and an engraving phenomenon of a reflective light due to a material phase become severe. The CD tilting phenomenon represents a phenomenon where a line thickness is periodically changed since a degree of interference between an incident light and a reflected light varies according to a thickness difference of a substrate film or that of a photoresist film.

Since the DUV process uses the chemically amplified photoresist to improve the optical sensitivity, there occur problems such as post exposure delay (PED) stability and material dependency, which are related to the chemical reaction mechanism. Therefore, one core subject of the ArF exposure technology is to develop new photoresist materials for the ArF exposure, i.e., new ArF photoresist materials. However, since a benzene ring cannot be contained, it is not easy to develop the photoresist material for the ArF exposure. The benzene ring has been contained in the photoresist for the i-line and KrF exposure so as to secure durability in a dry etching process. However, if the benzene ring is contained in the ArF photoresist materials, the absorbency at the 193 nm wavelength of the ArF laser becomes high and, therefore, the transparency is deteriorated. As a result, there occurs a problem of making a lower portion of the photoresist unexposed.

Therefore, there are in progress researches for developing photoresist materials capable of securing the durability in the dry etching process without containing the benzene ring, having a strong adhesive force and being developable at 2.38% TMAH. So far, many companies and institutes are publishing a lot of research results.

Currently, commercially available ArF photoresist materials include COMA (CycloOlefin-Maleic Anhydride), a polymer type belonging to an acrylate family, or their combination, which contains the benzene ring therein.

Referring to FIG. 1, there is exemplarily shown a cross-sectional view of pattern deformation and contact defects in a self-aligned contact (SAC) etching process for forming a landing plug contact (LPC) hole by using the ArF photoresist.

As illustrated in FIG. 1, there are sequentially formed a plurality of gate electrodes 11 and hard masks 12 on a substrate 10. Then, an insulating layer 13 for spacers is coated along the processing profile. An interlayer dielectric layer 14 is deposited on the insulting layer 13 and etched through an SAC etching process to thereby open a region between gate electrodes 11.

In the SAC etching process, fluorine-based gas was used as etching gas to obtain a desired etching profile. As a result, there occurs deformation in the photoresist pattern such as 'A' in FIG. 1, which is due to weak durability of the ArF photoresist pattern.

Furthermore, if there occurs misalignment in an over-etching process for avoiding the defect in the contact hole forming process, parts of the gate electrode 11 and the hard mask 12 are lost as shown in 'B' of FIG. 1, resulting in the deterioration of electrical properties of devices. Although there does not occur the misalignment, a width of the contact hole becomes narrower as depicted in 'C' of FIG. 1, leading increased contact resistance.

Moreover, although there is not illustrated in drawings, when forming contact holes such as an LPC hole through the photolithography using the ArF exposure source, there may occur striation in an ArF photoresist pattern, clustering of photoresist or plastic deformation, and wiggling of the photoresist during the contact hole being etched.

Accordingly, there is required to enhance the weak durability and weak physical properties of the ArF photoresist materials for the fluorine-based gas.

SUMMARY OF THE INVENTION

It is, therefore, an object of the present invention to provide a method capable of forming a narrow fine pattern in a semiconductor device by minimizing deformation of an ArF photoresist pattern by properly adjusting an etching temperature.

In accordance with an aspect of the present invention, there is provided a method for forming a fine pattern of a semiconductor device, comprising the steps of: (a) providing a semiconductor substrate; (b) sequentially forming an etch-target layer to be formed as the fine pattern, an anti-reflective layer and a photoresist film on the semiconductor substrate, performing photolithography for the photoresist film by using an ArF exposure source to thereby form a photoresist pattern; (c) etching the anti-reflective layer and a portion of a non-pattern area of the etch-target layer at a first substrate temperature with fluorine-based gas and argon gas by using the photoresist pattern as an etching mask; (d) etching a remaining portion of the non-pattern area of the etch-target layer at a second substrate temperature higher than the first substrate temperature with fluorine-based gas and argon gas to thereby form the fine pattern; and (e) removing the anti-reflective layer and the photoresist pattern to thereby form the fine pattern.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, some preferred embodiments of the present invention would be described in detail with reference to the accompanying drawings.

In accordance with the present invention, a first etching process for etching an anti-reflective coating layer is performed at low temperature around 0° C. and a second etching process for etching an etch-target layer to be formed as a desired pattern is executed at a temperature relatively higher than the first etching process. Therefore, it is possible to minimize deformation of a photoresist pattern because the deformation is primarily affected by the etching temperature in the first etching process of the above two etching processes.

Referring to FIGS. 2A to 2E, there are illustrated cross-sectional views of forming a landing plug contact hole by using ArF photoresist in accordance with an embodiment of the present invention.

Figure 1:
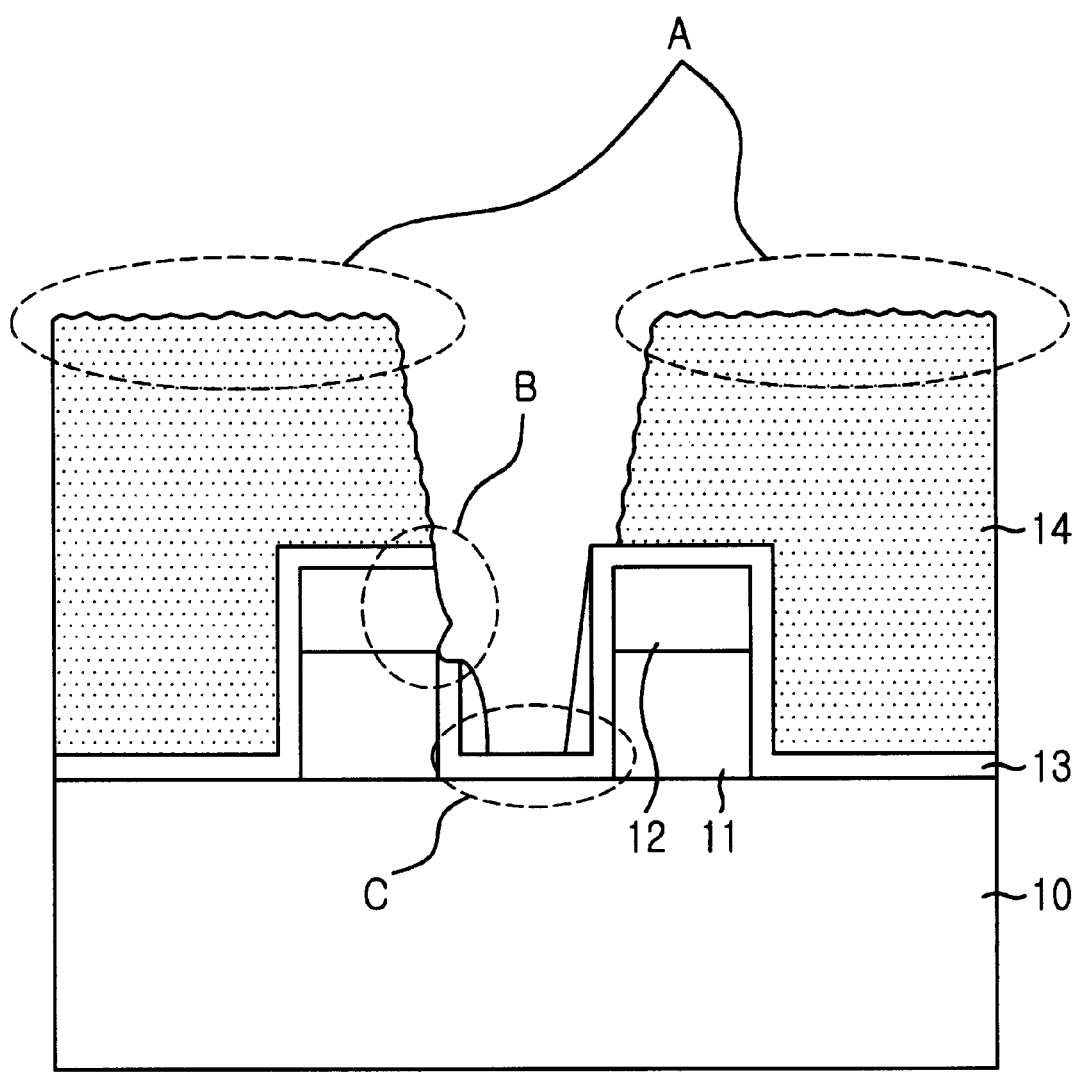
FIG. 1 shows a cross-sectional view of pattern deformation and contact defects caused in a self-aligned contact (SAC) etching process for forming a landing plug contact hole by using ArF photoresist.
Figure 2A:
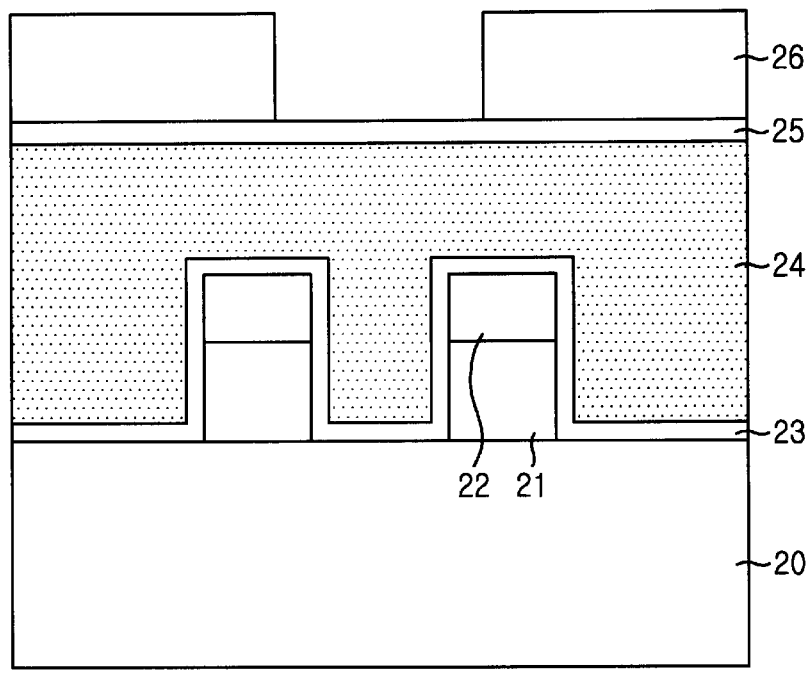
FIGS. 2A to 2E illustrate cross-sectional views of forming a landing plug contact hole by using ArF photoresist in accordance with an embodiment of the present invention.

First of all, as shown in FIG. 2A, there are formed on a semiconductor substrate 20 a plurality of conductive patterns, e.g., a gate electrode 21, by using polysilicon, and tungsten silicide or tungsten, wherein the substrate 20 includes various components previously formed therein or thereon to fabricate a semiconductor device. Herein, a gate-insulating layer is formed on the interface of the substrate 20 and the gate electrode 21 although it is not shown in the drawings.

A hard mask 22, e.g., a nitride layer, is formed on the gate electrode 21 to prevent the gate electrode 21 from being damaged in following processes, e.g., a self-aligned contact etching process for forming the landing plug contact hole.

Then, a spacer-insulating layer 23, e.g., a nitride layer, and an interlayer dielectric layer 24 are sequentially deposited along a whole profile of the processing product. The interlayer dielectric layer 24 is made of APL (advanced planarization layer) oxide layer, BPSG (boro phospho silicate glass), SOG (spin on glass), HDP (high density plasma) oxide layer or nitride layer.

An organic anti-reflective coating layer or nitride anti-reflective coating layer 25 is formed on the interlayer dielectric layer 24 at a thickness of 100 to 2000μ. An ArF photoresist film is coated on the anti-reflective coating layer 25 and patternized in a photolithography process using an ArF exposure source to thereby form a photoresist pattern 26.

Specifically, the photoresist pattern 26 is formed by coating the ArF photoresist film such as COMA (CycloOlfefin-Maleic Anhydride), acrylate or their combination on the anti-reflective layer 25 at a certain thickness of, e.g., 500 to 6000 Å, selectively exposing preset portions of the coated ArF photoresist film by using an ArF exposure source (not shown) and reticle (not shown), developing the selectively exposed ArF photoresist film, and removing the photoresist film residue through a cleaning process.

At this time, in order to enhance the durability of the photoresist pattern 26, electron beam irradiation or Ar ion implantation can be performed for the photoresist pattern 26.

In the above process, other photoresist materials reacting on ArF laser can be used to form the ArF photoresist film.

Figure 2B:
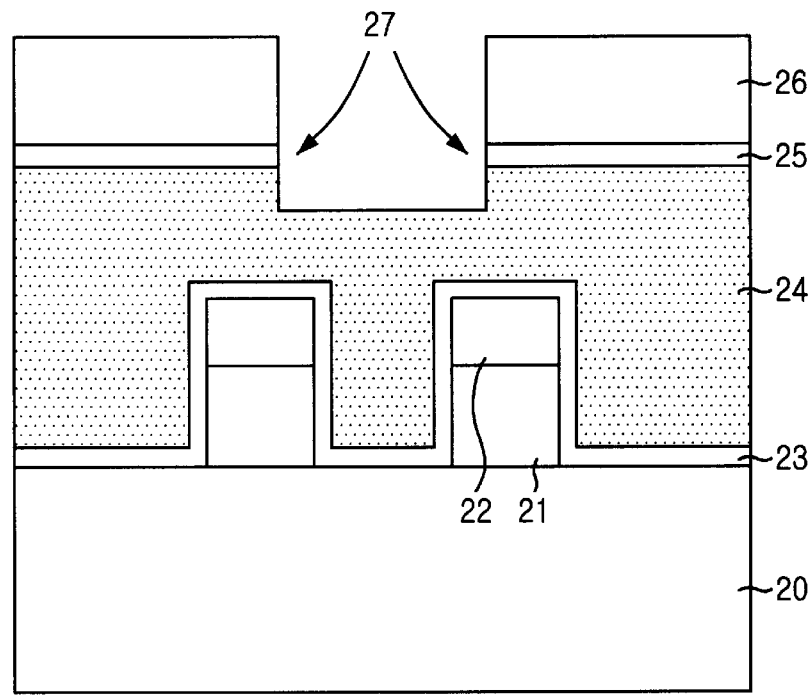

Subsequently, as depicted in FIG. 2B, a to-be-contact area is defined by selectively etching the anti-reflective coating layer 25 and a part of the interlayer dielectric layer 24 through the use of the photoresist pattern 26 as a mask as maintaining a temperature of the substrate 20 at about −40° C. to about 10° C. where polymer is not generated.

Since this etching process is performed as plasma etching by using fluorine-based gas, e.g., CxFy (x and Y being 1 to 10) gas, and Ar gas as main etching gas at the above low temperature, the polymer is not generated and, thus, there is obtained a perpendicular profile like '27' in FIG. 2B.

When partially etching the interlayer dielectric layer 24, it is preferable that an etching depth becomes less than ½ of a thickness of the interlayer dielectric layer 24 formed on the upper portion of the hard mask 22.

In accordance with a detailed embodiment of the present invention, the etching process is executed at two etching steps: one step being performed under etching conditions, i.e., a substrate temperature of −40° C. to 10° C., a pressure of 10 to 100 mTorr, a power of 200 to 500 W, Ar gas of 50 to 500 sccm, $CF_4$ gas of 50 to 200 sccm, $O_2$ gas of 10 to 50 sccm and CO gas of 10 to 50 sccm; and the other step being carried out under etching conditions, i.e., a substrate temperature of −40° C. to 10° C., a pressure of 10 to 100 mTorr, a power of 200 to 500 W, $CF_4$ gas of 50 to 200 sccm and $O_2$ gas of 1 to 10 sccm. The above two etching steps are performed singly or continuously.

More preferably, the etching process is performed through continuous etching steps under optimized etching conditions, i.e., a substrate temperature of 10° C., a pressure of 50 mTorr, a power of 300 W, Ar gas of 150 sccm, $CF_4$ gas of 80 sccm, $O_2$ gas of 20 sccm and CO gas of 20 sccm, and a substrate temperature of 10° C., a pressure of 25 mTorr, a power of 500 W, $CF_4$ gas of 100 sccm and $O_2$ gas of 3 sccm.

Figure 2C:
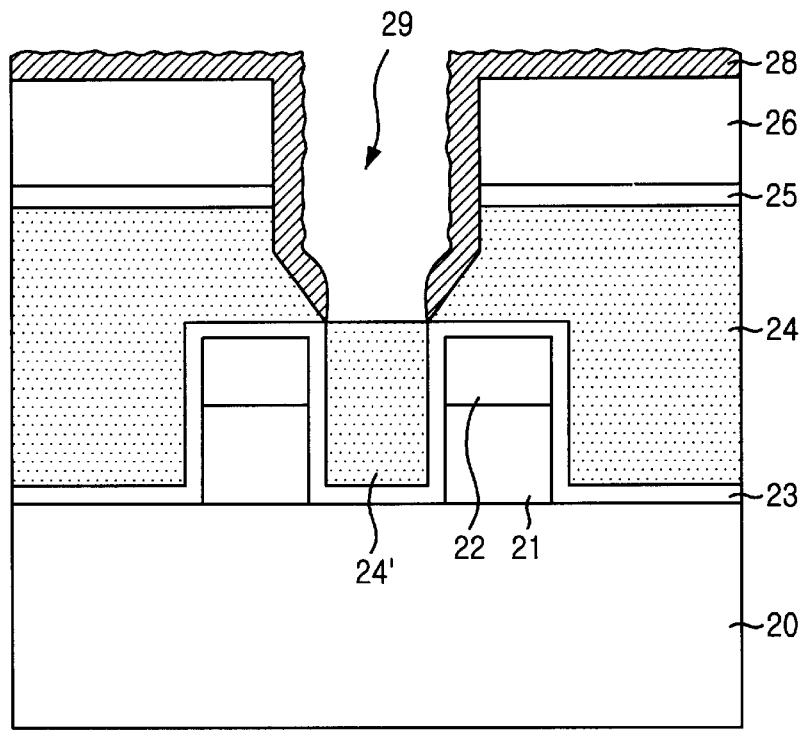

In FIG. 2C, as maintaining the substrate temperature at 20° C. to 100° C. higher than the above low temperature, i.e., −40° C. 10° C., the interlayer dielectric layer 24 is etched up to the top surface of the hard mask 22 through the use of the photoresist pattern 26 and its underlying layers as an etching mask. At this time, a large amount of polymer 28 is generated and adhered to the exposed portion of the photoresist pattern 26 and its underlying layers.

This etching process uses as main etching gas mixed gas of Ar gas, CxFy gas and CxFyHz (x, y and z being 1 to 10), e.g., $CH_3F$, $CHF_3$ or $CH_2F_2$, which is appropriate to generate the polymer. Oxygen gas can be added to the main etching gas to help the generation of the polymer 28.

As a result of the above etching process, an open area 29 is formed at an upper portion of the to-be-contact area.

In accordance with a detailed embodiment of the present invention, this etching process is executed under etching conditions, i.e., a substrate temperature of 20° C. to 100° C., a pressure of 20 to 200 mTorr, a power of 800 to 1500 W, Ar gas of 100 to 1000 sccm, $C_4F_6$ gas of 5 to 100 sccm, $O_2$ gas of 2 to 20 sccm and $CH_2F_2$ gas of 2 to 20 sccm.

More preferably, the etching process is performed under optimized etching conditions, i.e., a substrate temperature of 40° C., a pressure of 70 mTorr, a power of 900 W, Ar gas of 400 sccm, $C_4F_6$ gas of 10 sccm, $O_2$ gas of 4 sccm and $CH_2F_2$ gas of 3 sccm.

Figure 2D:
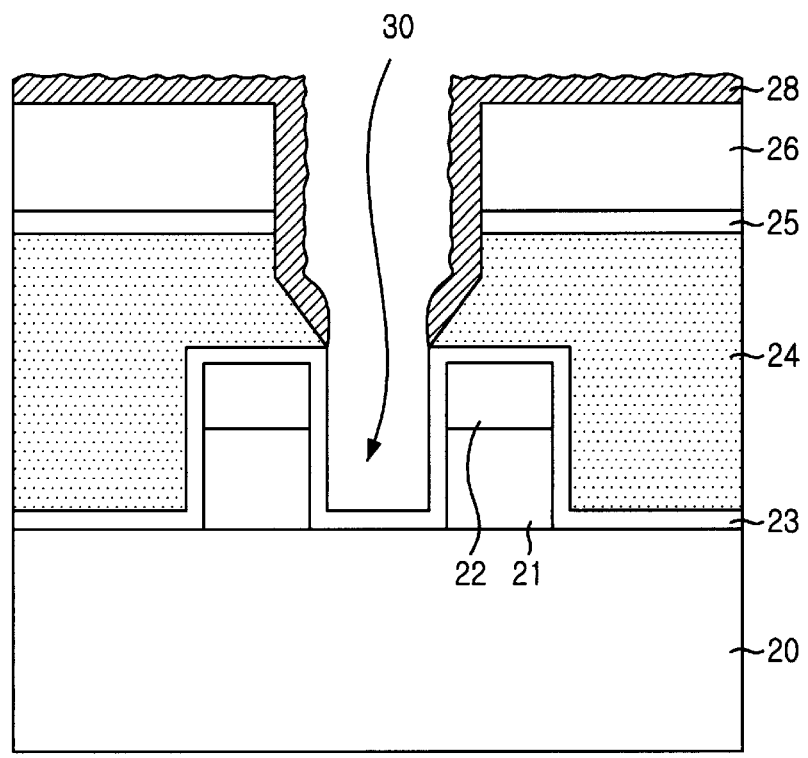

Subsequently, as illustrated in FIG. 2D, a contact hole 30 is formed by etching the interlayer dielectric layer 24' located in the to-be-contact area shown in FIG. 2C at a substrate temperature of 20° C. to 100° C. through the use of the photoresist pattern 26 and the polymer 28 as an etching mask. In this etching process, CxFy and Ar gas is utilized as main etching gas and oxygen gas is added thereto for the reproducibility of the etching process.

In accordance with a detailed embodiment of the present invention, this etching process is executed under etching conditions, i.e., a substrate temperature of 20° C. to 100° C., a pressure of 20 to 200 mTorr, a power of 800 to 1500 W, Ar gas of 100 to 1000 sccm, $C_4F_6$ gas of 5 to 100 sccm and $O_2$ gas of 2 to 20 sccm.

More preferably, the etching process is performed under optimized etching conditions, i.e., a substrate temperature of 40° C., a pressure of 70 mTorr, a power of 900 W, Ar gas of 400 sccm, $C_4F_6$ gas of 10 sccm and $O_2$ gas of 4 sccm.

Figure 2E:
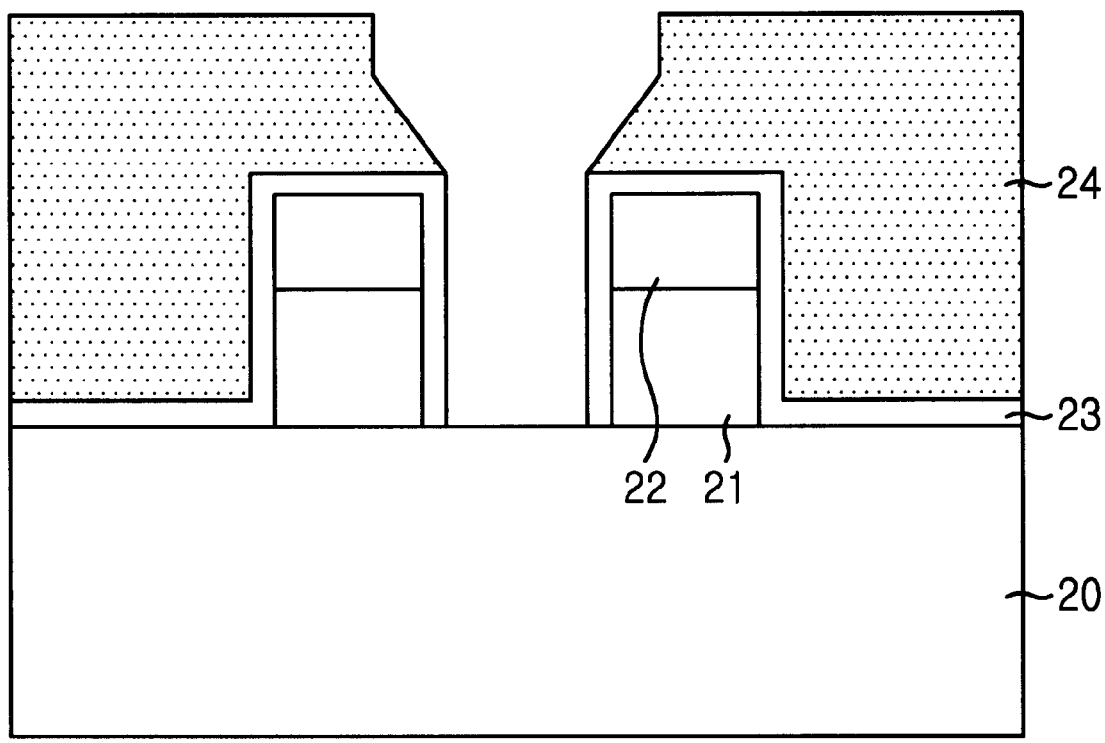

As shown in FIG. 2E, the nitride layer 23 in the to-be-contact area is removed through known fabrication processes of the semiconductor device and, then, this contact hole forming process is completed after performing a cleaning process for the processing product.

As described above, in accordance with the present invention, the contact hole forming process includes the three etching processes and, in each etching process, the substrate temperature and the amount of etching gas are properly adjusted to generate the polymer covering the surroundings of the photoresist pattern, so that the deformation of the photoresist pattern and the loss of the gate electrode can be minimized and it becomes possible to sufficiently secure a contact area.

The three etching processes can be implemented in a single chamber or in separate chambers.

The desired pattern, i.e., a target pattern, in the present invention can include isolated I type, T type and hole type patterns.

In the above, although there is only described the SAC etching process for forming the landing plug contact, the present invention can be applied to etching processes for forming a bit line contact, a bit line, a metal line, a gate electrode and so on, which require a fine pattern.

While the present invention has been described with respect to the particular embodiments, it will be apparent to those skilled in the art that various changes and modifications may be made without departing from the spirit and scope of the invention as defined in the following claims.

What is claimed is:

1. A method for forming a fine pattern of a semiconductor device, comprising the steps of:

(a) providing a semiconductor substrate;

(b) sequentially forming an etch-target layer to be formed as the fine pattern, an anti-reflective layer and a photoresist film on the semiconductor substrate, performing photolithography for the photoresist film by using an ArF exposure source to thereby form a photoresist pattern;

(c) etching the anti-reflective layer and a portion of a non-pattern area of the etch-target layer at a first substrate temperature with fluorine-based gas and argon gas by using the photoresist pattern as an etching mask;

(d) etching a remaining portion of the non-pattern area of the etch-target layer at a second substrate temperature higher than the first substrate temperature with fluorine-based gas and argon gas; and (e) removing the anti-reflective layer and the photoresist pattern to thereby form the fine pattern.

2. The method as recited in claim 1, wherein the first substrate temperature is in a range of about −40° C. to about 10° C.

3. The method as recited in claim 1, wherein the second substrate temperature is in a range of about 20° C. to about 100° C.

4. The method as recited in claim 1, wherein the step (d) includes the steps of:
 (d1) etching a part of the remaining portion of the non-pattern area by using the photoresist pattern as an etching mask and generating a large amount of polymer, which is, in turn, adhered to the surface of the photoresist pattern; and
 (d2) etching a remaining part of the remaining portion of the non-pattern area by using the photoresist pattern and the polymer as an etching mask.

5. The method as recited in claim 1, wherein the photoresist film is made of COMA (CycloOlefin-Maleic Anhydride), a polymer type belonging to an acrylate family, or their combination.

6. The method as recited in claim 1, after the step (b), further comprising the step of hardening the photoresist pattern.

7. The method as recited in claim 6, wherein the photoresist pattern hardening step uses electron beam irradiation or Ar ion implantation.

8. The method as recited in claim 2, wherein the step (c) uses mixed gas of Ar and $C_xF_y$, x and y being 1 to 10, as etching gas.

9. The method as recited in claim 8, wherein the step (c) is performed at a substrate temperature of about −40° C. to about 10° C. with Ar gas of about 50 to about 500 sccm, $C_xF_y$ gas of about 50 to about 200 sccm, oxygen gas of about 10 to about 50 sccm and CO gas of about 10 to about 50 sccm.

10. The method as recited in claim 9, wherein the step (c) further includes another etching step executed at a substrate temperature of about −40° C. to about 10° C. with $C_xF_y$ gas of about 50 to about 200 sccm and oxygen gas of 1 to 10 sccm.

11. The method as recited in claim 10, wherein the step (c) is performed through continuous etching steps under fabrication conditions, i.e., a substrate temperature of about 10° C., Ar gas of about 150 sccm, $CF_4$ gas of about 80 sccm, oxygen gas of about 20 sccm and CO gas of about 20 sccm, and $CF_4$ gas of about 100 sccm and oxygen gas of about 3 sccm.

12. The method as recited in claim 4, wherein the step (d1) uses mixed gas of Ar, $C_xF_y$ and $C_xF_yH_z$, x, y and z being 1 to 10, as etching gas.

13. The method as recited in claim 12, wherein the step (d1) is executed at a substrate temperature of about 20° C. to about 100° C. with Ar gas of about 100 to about 1000 sccm, $C_xF_y$ gas of about 5 to about 100 sccm, oxygen gas of about 2 to about 20 sccm and $C_xH_yF_z$ gas of about 2 to about 20 sccm.

14. The method as recited in claim 13, wherein the step (d1) is performed at a substrate temperature of about 40° C. with Ar gas of about 400 sccm, $C_4F_6$ gas of about 10 sccm, oxygen gas of about 4 sccm and $CH_2F_2$ gas of about 3 sccm.

15. The method as recited in claim 4, wherein the step (d2) is carried out at a substrate temperature of about 20° C. to about 100° C. with Ar gas of about 100 to about 1000 sccm, $C_xF_y$ gas of about 5 to about 100 sccm and oxygen gas of about 2 to about 20 sccm, x and y being 1 to 10.

16. The method as recited in claim 15, wherein the step (d2) is executed at a substrate temperature of about 40° C. with Ar gas of about 400 sccm, $C_4F_6$ gas of about 10 sccm and oxygen gas of about 4 sccm.

17. The method as recited in claim 1, wherein the steps (c) and (d) are performed in a single chamber.

18. The method as recited in claim 1, wherein the steps (c) and (d) are performed in separate chambers.

19. The method as recited in claim 1, wherein the fine pattern includes at least one of isolated I type, T type and hole type patterns.

\* \* \* \* \*